United States Patent [19]
Noguchi et al.

[11] Patent Number: 5,199,055
[45] Date of Patent: Mar. 30, 1993

[54] X-RAY LITHOGRAPHIC MASK BLANK WITH REINFORCEMENT

[75] Inventors: Hitoshi Noguchi; Yoshihiko Nagata; Meguru Kashida; Yoshihiro Kubota, all of Gunma, Japan

[73] Assignee: Shin-Etsu Chemical Co., Ltd., Tokyo, Japan

[21] Appl. No.: 908,330

[22] Filed: Jul. 6, 1992

[30] Foreign Application Priority Data

Aug. 5, 1991 [JP] Japan .................................. 3-219207

[51] Int. Cl.⁵ .............................................. G21K 5/00
[52] U.S. Cl. ........................................ 378/35; 378/210
[58] Field of Search ........................ 378/35, 34; 430/5

[56] References Cited
FOREIGN PATENT DOCUMENTS 55-15256 2/1980 Japan ...................................... 378/35

Primary Examiner—Craig E. Church
Attorney, Agent, or Firm—McAulay Fisher Nissen Goldberg & Kiel

[57] ABSTRACT

Proposed is a high-precision X-ray lithographic mask blank with reinforcement free from warping or distortion. The mask blank is an integral body comprising: (a) a frame made from a silicon wafer; (b) a membrane of an X-ray permeable material such as silicon carbide adhering to and supported by one surface of the frame; and (c) a reinforcing member made from a single crystal of silicon adhesively bonded to the other surface of the frame with (d) a layer of silicon oxide intervening between the frame and the reinforcing member. The mask blank can be prepared in a process of first forming a layer of silicon oxide on the surface of the silicon wafer and/or reinforcing member prior to deposition of the X-ray permeable film on the silicon wafer and heating them together at a temperature of 800° C. or lower while they are in direct contact with each other with the silicon oxide layer intervening therebetween.

12 Claims, 2 Drawing Sheets

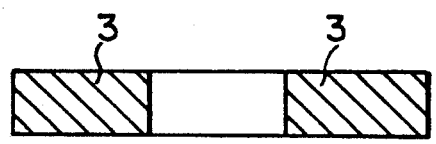
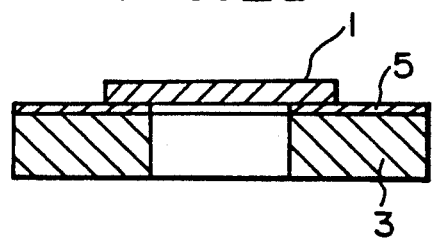
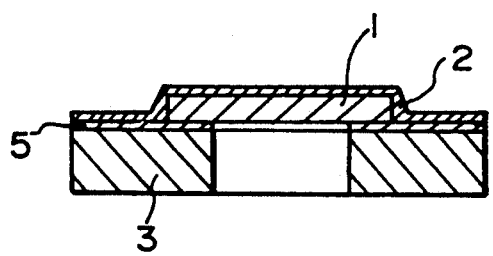
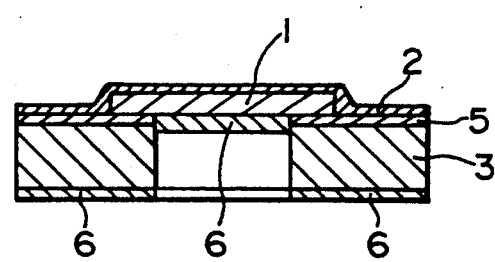
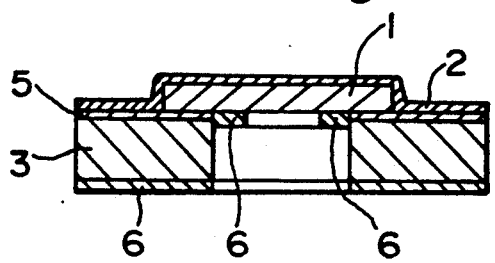
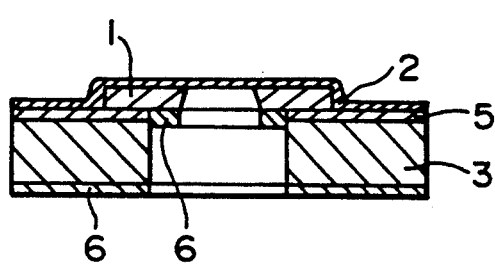

X-RAY LITHOGRAPHIC MASK BLANK WITH REINFORCEMENT

BACKGROUND OF THE INVENTION

The present invention relates to an X-ray lithographic mask blank or, more particularly, to a reinforced X-ray lithographic mask blank free from warping or distortion and capable of giving a mask for high-precision X-ray lithographic patterning.

Along with the trend in recent years in the manufacture of semiconductor devices toward more and more increased fineness in the pattering on the surface of a substrate such as a semiconductor silicon wafer, the traditional photolithographic patterning method is under continuous replacement with the X-ray lithographic method which is highlighted in respect of the higher resolution in patterning. This X-ray lithographic patterning is conducted by using, like the photomask used in the photolithography, an X-ray lithographic mask which is a frame-supported X-ray permeable membrane having a thickness of 10 μm or smaller and bearing a desired pattern formed from an X-ray impermeable material. It is conventional that the frame supporting the membrane, which usually cannot be thick enough to keep high rigidity, in turn is supported by a reinforcing member adhesively bonded thereto so as to be completely freed from any wrapping or distortion otherwise unavoidable in handling.

The material forming the X-ray permeable membrane is selected from boron nitride, silicon nitride, silicon carbide and the like composed of light elements alone having a small X-ray absorption coefficient and highly resistant against chemicals and high-energy beam irradiation while the X-ray impermeable patterning material is selected from heavy metals or inorganic compounds of a heavy metal such as gold, tungsten, tantalum and the like having a large X-ray absorption coefficient. It is also understood that the X-ray permeable membrane should be in a tensioned condition with an internal stress of $5 \times 10^8$ to $5 \times 10^9$ dyn/cm$^2$ in order to ensure good stability of the membrane form and the X-ray impermeable pattern formed thereon.

The frame as the substrate to support the membrane is usually a mirror-polished silicon wafer having a thickness of 0.3 to 2.0 mm in respect of the susceptibility to etching with an alkaline solution in the process for the preparation of the X-ray lithographic mask blank. Namely, deposition of the membrane material, e.g., silicon carbide, takes place on the surface of the silicon wafer in a suitable thickness to form a deposited film by the sputtering method, chemical vapor-phase deposition (CVD) method and the like and then the silicon wafer is subject to etching from the surface reverse to the deposited film of silicon carbide and the like leaving a circumferential area to serve as a frame supporting the membrane. This is the reason for the limited thickness of the substrate as the frame in consideration of the too long time taken for etching to remove the silicon wafer if it has a large thickness.

High-purity silicon per se is a relatively brittle material with low mechanical strengths so that the silicon wafer as the substrate frame to support the membrane is subject to warping or distortion in preparation and handling of the lithographic mask if it is not broken. Accordingly, it is sometimes necessary that the frame supporting the membrane is provided with a reinforcing member adhesively bonded thereto. In view of the requirement for an approximately equal thermal expansion coefficient with the silicon wafer forming the frame, several grades of borosilicate glass are used as the material of the reinforcing member. It is usual that such a glass-made reinforcing member is bonded to the frame by using an organic adhesive such as an epoxy adhesive, having a high adhesive bonding strength.

When the frame and the reinforcing member are bonded together by using an adhesive, the thickness of the adhesive layer cannot be small enough and is usually in the range from 30 to 100 μm in order to ensure a high adhesive bonding strength. Such a large thickness of the adhesive layer causes a serious problem that even a relatively small unevenness in the thickness of the adhesive layer may adversely affect the parallelism between the reinforcing member as the base of the mask and the frame or, hence, the frame-supported membrane, while the parallelism should desirably be perfect within a deviation of a few micrometers. Moreover, even the very small difference in the thermal expansion coefficients between a silicon wafer and borosilicate glass, the values being $2.4 \times 10^{-6}/°C$. and $3.5 \times 10^{-6}/°C$., respectively, cannot be neglected when the requirement for the accuracy of patterning is extremely high because distortion of the frame may take place even by a relatively small change in temperature.

The above mentioned problem due to the difference in the thermal expansion coefficients between the materials of the frame and the reinforcing member can of coarse be solved when they are made from one and the same material. Namely, it is proposed in Japanese Patent Kokai No. 2-162714 to form the reinforcing member from a single crystal of semiconductor silicon which is the same material as that of the membrane-supporting frame. A problem in this case consists in the method for adhesively bonding the frame and the reinforcing member in order to obtain a practical adhesive bonding strength. As proposed in the above patent document, the frame and the reinforcing member are directly contacted with each other and the assembly is heated in a non-oxidizing atmosphere at a temperature of 900° C. or higher or, preferably, 1000° C. or higher for a length of time of at least 30 minutes or, preferably, at least 60 minutes to cause seizing therebetween. The above mentioned conditions for the heat treatment may be beyond the limit of the thermal stability of the X-ray permeable membrane so that a change is unavoidably caused in the internal stress of the membrane to affect the accuracy of the pattern thereon even if it eventually be not broken.

It would be an alternative idea that, prior to the deposition of the film of silicon carbide and the like on one of the surfaces of the silicon wafer, a frame-formed reinforcing member made from a silicon single crystal having a sufficient thickness is bonded to the other surface of the silicon wafer be the above mentioned method of high-temperature direct bonding followed by the deposition of the silicon carbide film and processing thereof into a frame-supported membrane. This method, however, cannot provide a complete solution of the problem because the heat treatment at such a high temperature sometimes causes warping or distortion of the bonded body and decrease in the smoothness of the surface of the silicon wafer on which the film of silicon carbide and the like is to be subsequently deposited if not to mention the cost for the installation of a high-temperature furnace.

Japanese Patent Publication 39-17869 teaches that two silicon wafer can be bonded together when they are directly contacted and heated in an oxidizing atmosphere under a higher pressure such as oxygen at about 650° C. for 1 as a result of formation of a thin layer of silicon oxide on the contacting surfaces.

SUMMARY OF THE INVENTION

The present invention accordingly has an object to provide an X-ray lithographic mask blank with reinforcement free from the above described problems and disadvantages in the X-ray lithographic mask blanks of the prior art as well as to provide a method for preparation of such an improved X-ray lithographic mask blank.

Thus, the X-ray lithographic mask blank with reinforcement of the invention is an integral body comprising:

(a) a frame made from a silicon wafer;
(b) an X-ray permeable membrane adhering to and supported by one surface of the frame made from a silicon wafer; and
(c) a reinforcing member made from a single crystal of silicon adhesively bonded to the other surface of the frame made from a silicon wafer with
(d) a layer of silicon oxide intervening between the frame and the reinforcing member.

The above define integral body as the mask blank can be prepared by a process comprising the steps of:

(A) forming a layer of silicon oxide on one surface of a silicon wafer or on the surface of a reinforcing member made from a silicon single crystal;
(B) bringing the silicon wafer and the reinforcing member into contact with the layer of silicon oxide intervening therebetween;
(C) heating the assembly of the silicon wafer and the reinforcing member made from a single crystal of silicon in contact with each other with an intervening layer of silicon oxide so as to integrally bonding the silicon wafer and the reinforcing member;
(D) depositing a film of an X-ray permeable material on the surface of the silicon wafer reverse to the reinforcing member; and
(E) etching the silicon wafer from the surface reverse to the deposited film in the area not bonded to the reinforcing member to expose the deposited film bare.

BRIEF DESCRIPTION OF THE DRAWING

FIGS. 2a to 2h are each a schematic cross sectional illustration of one of the steps for the preparation of an X-ray lithographic mask blank with reinforcement according to the invention.

DETAILED DESCRIPTION OF THE PREFERRED EMBODIMENTS

Figure 1:
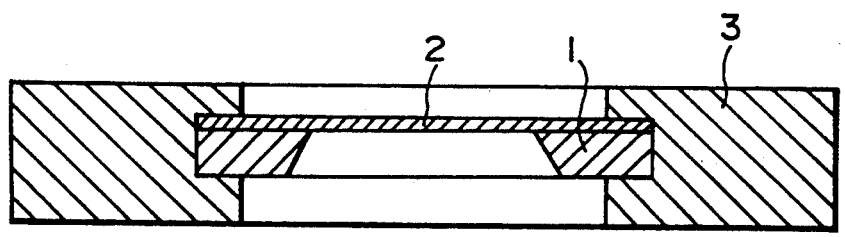
FIG. 1 is a cross sectional view of a conventional frame-supported X-ray lithographic mask blank with reinforcement as an example.

As is described above, the most characteristic feature of the invention consists in that the reinforcing member, which is made from a silicon single crystal, and the silicon wafer to form the frame supporting the membrane are integrally bonded together not by using an organic adhesive or by mere thermal seizing of the silicon-made two parts but by means of a layer of silicon oxide intervening therebetween. Advantageously, the bonding treatment utilizing the silicon oxide layer can be performed at a relatively low temperature so that the problem of thermal distortion caused by a high-temperature treatment can be solved. Further, the thickness of the silicon oxide layer intervening between the reinforcing member and the silicon wafer can be very small to give a sufficiently high adhesive binding strength so that the problem due to the unevenness in the thickness of the adhesive layer can be avoided so as to ensure high parallelism between the membrane and the reinforcing member as the base of the mask blank.

As in the conventional X-ray lithographic mask blanks illustrated in FIG. 1 by a cross section comprising a supporting frame 1 made from a silicon wafer, an X-ray permeable membrane 2 formed on the silicon wafer and a reinforcing member 3, a semiconductor single crystal silicon wafer is used also in the invention as the substrate on which a film of an X-ray permeable material such as silicon carbide is deposited. The diameter of the silicon wafer naturally depends on the desired size of the X-ray lithographic mask blank but is usually in the range from 2 to 4 inches. The thickness of the silicon wafer should be selected in consideration of the balance between the mechanical strengths and the time taken for the step of etching after deposition of the X-ray permeable film thereon in the process for the preparation of the mask blank. In this regard, the silicon wafer should preferably have a thickness in the range from 0.3 to 2.0 mm. Further, it is preferable that the plane of the silicon wafer has a crystallographic orientation of (100) in consideration of the higher efficiency of etching with an aqueous alkaline etching solution than otherwise.

It is important that the silicon wafer has at least one mirror-polished surface on which the film of an X-ray permeable material is to be deposited since the smoothness or roughness of the substrate surface is directly transferred to the X-ray permeable membrane. The other surface is also desirably mirror-polished in order to ensure accuracy of bonding to the reinforcing member with an intervening layer of silicon oxide.

The following is a description of the process for the preparation of the inventive mask blank with reference to FIGS. 2a to 2h.

The reinforcing member 3, which is bonded to the silicon wafer 1, is also made from a single crystal of semiconductor silicon. Though not particularly limitative, the reinforcing member 3 is fabricated into the form of a square or circular frame having an inside dimension sufficient to support the silicon wafer 1 mounted thereon. The reinforcing member 3 should have a thickness to ensure good rigidity not to cause warping or distortion in handling but not to be too heavy. In this regard, the thickness thereof is preferably in the range from 3 to 10 mm or, more preferably, from 5 to 7 mm. For example, a single crystal rod of silicon having a diameter of 5 to 8 inches are sliced into a disc having the above mentioned thickness to serve as the base material of the reinforcing member 3. It is preferable that the thus obtained disc of the silicon single crystal is mirror-polished on at least the surface at which the reinforcing member 3 is bonded to the silicon wafer 1 since a rough surface thereof would require a thick layer of silicon oxide in order to ensure high accuracy of bonding eventually leading to occurrence of distortion. It is preferable that the surface of the reinforcing member 3, at which the reinforcing member 3 is bonded to the silicon wafer 1, has the same crystallographic orientation as the surface of the silicon wafer 1 in order to minimize the difference in the thermal expansion coefficients therebetween.

The disc of the silicon single crystal is bored to make an opening which is wide enough to be larger than the desired membrane but small enough not to fail to provide a support for the silicon wafer. When the desired membrane is in a circular form having a diameter of 20 to 30 mm or in a square form having a side of 20 to 30 mm long, for example, the reinforcing member 3 is preferably in the form of a circular frame having an outer diameter of 40 mm or in the form of a square frame having an outside length of 40 mm a side.

In step (A) of the inventive method, a layer 5 of silicon oxide is formed on the surface of the silicon wafer 1 and/or the surface of the reinforcing member 3 (see FIG. 2c) at which they are to be brought into direct contact each with the other. The thickness of the silicon oxide layer 5 is preferably in the range from 1 to 1000 nm or, more preferably, from 10 to 500 nm. Such a silicon oxide layer can be readily formed when the silicon wafer 1 or the reinforcing member 3 is heated in an oxidizing atmosphere such as air, oxygen or, preferably, water vapor at a temperature of 800° C. or higher but not to exceed 1000° C. The chemical vapor-phase deposition method and sputtering method can also be applied to the formation of the silicon oxide layer 5 according to a known procedure.

In step (B) of the inventive method, the silicon wafer 1 and the reinforcing member 3 after formation of the silicon oxide layer 5 on one or both of them are brought into direct contact with each other (see FIG. 2d) at the surface where the silicon oxide layer 5 has been formed in step (A) in an exact positioning. It is essential that they are tightly fastened together by putting a suitable weight thereon or by clamping with suitable clamps so as not to cause displacement in the subsequent steps.

In step (C) of the inventive method, the assembly obtained in step (B) is heated in vacuum or in an atmosphere of an inert gas such as argon at a temperature in the range from 200° to 800° C. or, preferably, from 300° to 600° C. for a length of time in the range from 1 to 20 hours or, in most cases, from 3 to 8 hours so that the two parts are firmly bonded together with an intervening layer 5 of silicon oxide therebetween (see FIG. 2d).

In step (D) of the inventive method, deposition of a film 2 of an X-ray permeable material, such as silicon nitride, boron nitride, silicon carbide and the like, is caused on the surface of the silicon wafer 1 as the substrate reverse to the reinforcing member 3 by a known process of chemical vapor-phase deposition and the like (see FIG. 2e). The conditions of this process and requirements for the deposited film 2 are well known in the art of X-ray lithographic masks so that no further description need not be given here thereon.

In step (E) of the inventive method, the silicon wafer 1 is subjected to an etching treatment on the surface reverse to the film 2 deposited in step (D) leaving the X-ray permeable membrane 2 in a frame-supported form. This process is also well known in the art. Namely, the surfaces of the silicon wafer 1 and the reinforcing member 3 are provided with a layer 6 of an etching resist (see FIG. 2f) and then the resist layer 6 is removed on the area where the silicon wafer 1 is to be etched away by a suitable means such as plasma etching (see FIG. 2g). Thereafter, the surface of the silicon wafer 1 not provided with the etching resist layer 6 is subjected to an etching treatment by using a suitable alkaline etching solution such as an aqueous solution of potassium hydroxide until the silicon wafer 1 in the area has been completely removed by etching to expose the surface of the deposited film 2, which has been supported by the silicon wafer 1 before etching, bare (see FIG. 2h) to complete a mask blank for X-ray lithography comprising an X-ray permeable membrane 2 supported by the silicon wafer 1 in the form of a frame which in turn is adhesively bonded to the reinforcing member 3 with a layer 5 of silicon oxide intervening therebetween.

The following is a more detailed description of the invention by way of examples and comparative examples which, however, never limit the scope of the invention in any way.

EXAMPLES 1 TO 9

A substrate for film deposition was prepared by mirror-polishing both surfaces of a silicon wafer of 3-inch diameter having a thickness of 0.6 mm, of which the surface had a crystallographic orientation of the plane of (100). Separately, a 100 mm by 100 mm square reinforcing member was prepared by slicing a single crystal rod of semiconductor silicon in a thickness of 5 mm and mirror-polishing one of the surfaces followed by making of a circular opening of 55 mm diameter at the center thereof.

In each of the Examples, the thus prepared reinforcing member was heated in an atmosphere of water vapor under a pressure of 1 atmosphere at a temperature of 950° C. for a varied length of time in the range from 1 to 48 hours so as to form a layer of silicon oxide on the mirror-polished surface having a thickness in the range from 20 to 1000 nm as indicated in Table 1.

The silicon wafer of 3 inches diameter was mounted concentrically on the surface of the reinforcing member provided with the silicon oxide layer and heated, with a suitable weight put thereon to prevent displacement, in vacuum for 3 hours at a varied temperature of 300° to 800° C. indicated in Table 1 so that the silicon wafer and the reinforcing member were found to be firmly bonded together into an integral body.

The assembly of the silicon wafer and the reinforcing member was brought into a RF magnetron sputtering chamber and a film of silicon carbide having a thickness of 1.5 $\mu$m as an X-ray permeable material was deposited on the outer surface of the silicon wafer according to a conventional procedure. In the next place, a 0.5 $\mu$m thick film of silicon nitride was deposited by the plasma-induced CVD method on the back surface of the silicon wafer as an etching resist against an alkaline etching solution and a 25 mm by 25 mm wide square area of the resist film at the center was removed by the dry etching method using carbon tetrafluoride gas as the etchant to expose the surface of the silicon wafer. Finally, the silicon wafer in this exposed area was etched away by using a 20% aqueous solution of potassium hydroxide at 90° C. taking 5 hours leaving the film of silicon carbide in the form of a frame-supported membrane suitable as an X-ray lithographic mask blank.

The above obtained mask blank was subjected to the tests of the adhesive bonding strength between the silicon wafer and the reinforcing member and warping of the reinforcing member in the following procedures.

Adhesive bonding strength:

A pulling force of 10 kg was added between the silicon wafer and the reinforcing member to separate them apart. The result was recorded as "good" when no separation took place and "poor" when they became separated.

Warping:

A flatness tester was used to measure warping of the reinforcing member and the result was evaluated as "good" when the value of warping did not exceed 10 μm and "poor" when the value exceeded 10 μm, which is the upper limit of acceptable warping for an X-ray lithographic mask blank.

The results of the above tests in Examples 1 to 9 were that the adhesive bonding strength was "good" in each of the examples and warping was also "good" in each of the examples giving a value of 1 μm in all of the examples excepting Examples 5 and 9 in which the value of warping was 2 μm.

These mask blanks were each processed into a quite satisfactory patterned X-ray lithographic mask by first forming a 2.0 μm thick tantalum film on the surface of the silicon carbide membrane by the sputtering method followed by pattern-wise dry etching by the RIE method using a gaseous mixture of carbon tetrachloride and chlorine.

COMPARATIVE EXAMPLES 1 TO 4

A silicon wafer and a reinforcing member having the same dimensions as in Examples described above before formation of a silicon oxide film were bonded together by coating with an epoxy-based adhesive (Araldite, a product by Ciba Geigy Co.) in a varied thickness of 10 to 100 μm indicated in Table 2 and heating at 150° C. for 2 hours to cure the adhesive. The results of the testing are shown in Table 2.

COMPARATIVE EXAMPLES 5 TO 7

A silicon wafer and a reinforcing member having the same dimensions as in Examples described above before formation of a silicon oxide film were bonded together by merely bringing them into direct contact without using an adhesive and heating them together under a suitable weight for 2 hours at a varied temperature of 800° to 1200° C. indicated in Table 3 to effect thermal seizure. The results of the testing are shown in Table 3.

TABLE 1

| Example No. | Thickness of silicon oxide layer, nm | Heating temperature of bonding treatment, °C. |
|---|---|---|
| 1 | 20 | 500 |
| 2 | 50 | 500 |
| 3 | 100 | 500 |
| 4 | 500 | 500 |
| 5 | 1000 | 500 |
| 6 | 100 | 300 |
| 7 | 100 | 400 |
| 8 | 100 | 600 |
| 9 | 100 | 800 |

TABLE 2

| Comparative Example No. | Thickness of adhesive, μm | Adhesive bonding strength | Warping, μm |
|---|---|---|---|
| 1 | 10 | poor | — |
| 2 | 20 | poor | — |
| 3 | 50 | good | 75 |
| 4 | 100 | good | 120 |

TABLE 3

| Comparative Example No. | Heating temperature, °C. | Adhesive bonding strength | Warping, μm |
|---|---|---|---|
| 5 | 800 | poor | — |
| 6 | 1000 | good | 40 |
| 7 | 1200 | good | 70 |

What is claimed is:

1. An X-ray lithographic mask blank with reinforcement which is an integral body comprising:
   (a) a frame made from a silicon wafer;
   (b) an X-ray permeable membrane adhering to and supported by one surface of the frame made from a silicon wafer; and
   (c) a reinforcing member made from a single crystal of silicon adhesively bonded to the other surface of the frame made from a silicon wafer with
   (d) a layer of silicon oxide intervening between the frame and the reinforcing member.

2. The X-ray lithographic mask blank with reinforcement as claimed in claim 1 in which the layer of silicon oxide has a thickness in the range from 1 to 1000 nm.

3. The X-ray lithographic mask blank with reinforcement as claimed in claim 1 in which the reinforcing member has a form of a frame.

4. The X-ray lithographic mask blank with reinforcement as claimed in claim 1 in which the reinforcing member has a thickness in the range from 3 to 10 mm.

5. The X-ray lithographic mask blank with reinforcement as claimed in claim 2 in which the layer of silicon oxide has a thickness in the range from 10 to 500 nm.

6. The X-ray lithographic mask blank with reinforcement as claimed in claim 4 in which the reinforcing member has a thickness in the range from 5 to 7 mm.

7. A method for the preparation of an X-ray lithographic mask blank with reinforcement which comprises the steps of:
   (A) forming a layer of silicon oxide on one surface of a silicon wafer or on the surface of a reinforcing member made from a silicon single crystal;
   (B) bringing the silicon wafer and the reinforcing member into contact with the layer of silicon oxide intervening therebetween;
   (C) heating the assembly of the silicon wafer and the reinforcing member made from a single crystal of silicon in contact with each other with an intervening layer of silicon oxide in vacuum or in an atmosphere of an inert gas so as to integrally bond the silicon wafer and the reinforcing member;
   (D) depositing a film of an X-ray permeable material on the surface of the silicon wafer reverse to the reinforcing member; and
   (E) etching the silicon wafer from the surface reverse to the deposited film in the area not bonded to the reinforcing member to expose the deposited film bare.

8. A method for the preparation of an X-ray lithographic mask blank with reinforcement as claimed in claim 7 in which the layer of silicon oxide is formed by heating the silicon wafer or the reinforcing member made from a silicon single crystal in an oxidizing atmosphere at a temperature of 800° C. or higher.

9. A method for the preparation of an X-ray lithographic mask blank with reinforcement as claimed in claim 7 in which the layer of silicon oxide is formed in step (A) has thickness in the range from 1 to 1000 nm.

10. A method for the preparation of an X-ray lithographic mask blank with reinforcement as claimed in claim 7 in which the temperature of heating in step (C) is in the range from 200° to 800° C.

11. A method for the preparation of an X-ray lithographic mask blank with reinforcement as claimed in claim 10 in which the temperature of heating in step (C) is in the range from 300° to 600° C.

12. A method for the preparation of an X-ray lithographic mask blank with reinforcement as claimed in claim 8 in which the oxidizing atmosphere is an atmosphere of water vapor.

* * * * *